United States Patent [19]

Kohno

[11] Patent Number: 5,219,767

[45] Date of Patent: Jun. 15, 1993

[54] PROCESS FOR PREPARING SEMICONDUCTOR DEVICE

[75] Inventor: Hiroshi Kohno, Tokyo, Japan

[73] Assignee: NEC Corporation, Tokyo, Japan

[21] Appl. No.: 748,694

[22] Filed: Aug. 22, 1991

[30] Foreign Application Priority Data

Aug. 22, 1990 [JP] Japan .................. 2-220215

[51] Int. Cl.⁵ .................................. H01L 21/265
[52] U.S. Cl. ........................... 437/31; 437/101; 437/247; 437/909; 148/DIG. 1; 148/DIG. 11
[58] Field of Search ............... 437/31, 101, 89, 105, 437/106, 247, 909, 31; 148/DIG. 1, DIG. 11, DIG. 124

[56] References Cited

U.S. PATENT DOCUMENTS 4,563,807 1/1986 Sakai et al. ............... 437/106
4,853,342 8/1989 Taka et al. ............... 437/101
4,968,635 11/1990 Hamaraki ............... 437/26

*Primary Examiner*—Brian E. Hearn
*Assistant Examiner*—Tuan Nguyen
*Attorney, Agent, or Firm*—Laff, Whitesel, Conte & Saret

[57] ABSTRACT

Disclosed is a process for preparing a semiconductor device which comprises a step of growing, in a molecular beam epitaxial growth apparatus, a P-type silicon epitaxial layer which becomes the base, on an N-type silicon epitaxial layer which becomes the collector; a step of growing, in a molecular beam epitaxial growth apparatus, an antimony doped N-type silicon amorphous layer which becomes the emitter, on said P-type silicon epitaxial layer; and a step of converting the above N-type silicon amorphous layer to an N-type silicon epitaxial layer by the solid phase epitaxy method according to the annealing heat treatment.

3 Claims, 7 Drawing Sheets

PROCESS FOR PREPARING SEMICONDUCTOR DEVICE

BACKGROUND OF THE INVENTION

This invention relates to a process for preparing a semiconductor device, particularly to a silicon bipolar transistor with the base and the emitter being grown by a molecular beam epitaxial growth apparatus and a composite device thereof.

The process for preparing a silicon bipolar transistor according to the prior art is described by referring to FIGS. 1 (a) to (f).

First, as shown in FIG. 1 (a), on a P-type silicon substrate 11 is grown an N$^-$-type epitaxial layer 13 with a thickness of 1.3 to 1.6 μm, a specific resistivity of 1.3 to 1.0 Ω.cm, and a silicon oxide film 6 with a thickness of 500 to 600 Å is formed according to the spot LOCOS method.

Next, as shown in FIG. 1 (b), phosphorus is ion injected with a photoresist as the mask to form an N$^+$-type collector withdrawal portion 23, followed by ion injection of boron with a photoresist as the mask to form a base 14.

Next, as shown in FIG. 1 (c), a silicon nitride film 7 with a thickness of 1000 to 1500 Å is deposited according to the CVD method, and then the silicon oxide film 6 of the emitter and collector contact, and the silicon nitride film 7 of the emitter, collector contact and base contact are etched according to the RIE method by use of a gas such as CF$_4$, etc. Thereafter, a polysilicon 17 with a thickness of 1500 Å is grown according to the CVD method, and arsenic is ion injected to form an N$^+$ type emitter 16.

Next, as shown in FIG. 1 (d), with a photoresist as the mask, unnecessary polysilicon is removed by dry etching by use of a gas such as CF$_4$, etc.

Next, as shown in FIG. 1 (e), with a photoresist as the mask, the silicon oxide film 6 at the base contact portion is etched to have boron thermally diffused, thereby forming a p$^+$-type external base 15.

Next, as shown in FIG. 1 (f), by forming the base electrode 9, the emitter electrode 10 and the collector electrode 22, the device portion is completed.

Thus, for the emitter of the silicon bipolar transistor, polysilicon growth and the arsenic ion injection method or the DOPOS method are employed.

Then, by high temperature heat treatment, activation of arsenic and emitter junction formation are effected.

On the other hand, MBE apparatus has begun to be applied to formation of a thin base layer of silicon bipolar transistor as the low temperature growth means in which a steep impurity distribution or a silicon-germanium mixed crystal (hereinafter abbreviated as SiGe mixed crystal) is obtained.

Even if a thin base may be grown elaborately by means of MBE apparatus, when high temperature heat treatment is applied thereafter for activation of arsenic in the emitter, the impurity profile will be changed to deteriorate the characteristics.

Even by use of an SiGe mixed crystal without crystal defect grown by MBE apparatus, when heat treatment is thereafter effected at the growth temperature or higher, misfit or dislocation may be generated, whereby there has been involved the problem that the leak current is increased, etc.

Even if it is attempted to form an emitter at low temperature by means of MBE apparatus, antimony which has been generally employed as the N-type impurity source of MBE is low in solid solubility, whereby there has been also involved the problem that no high concentration doping necessary for emitter can be effected.

SUMMARY OF THE INVENTION

The process for preparing the semiconductor device of the present invention comprises using a P-type epitaxial layer grown by MBE apparatus on an N-type epitaxial layer as the base, growing an antimony-doped amorphous silicon layer thereon in MBE apparatus, and then converting it to an epitaxial layer by solid phase epitaxy by heat treatment, thereby forming an emitter.

DETAILED DESCRIPTION OF THE INVENTION

Figure 1A:
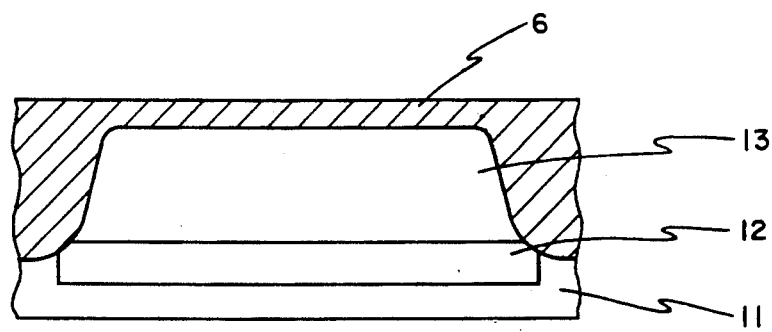
FIGS. 1 (a) to (f) are sectional views showing sequentially the process for preparing the bipolar transistor according to the prior art.
Figure 1B:
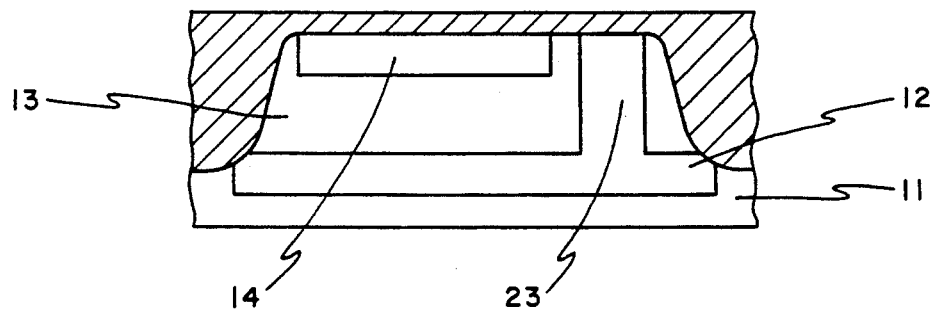
Figure 1C:
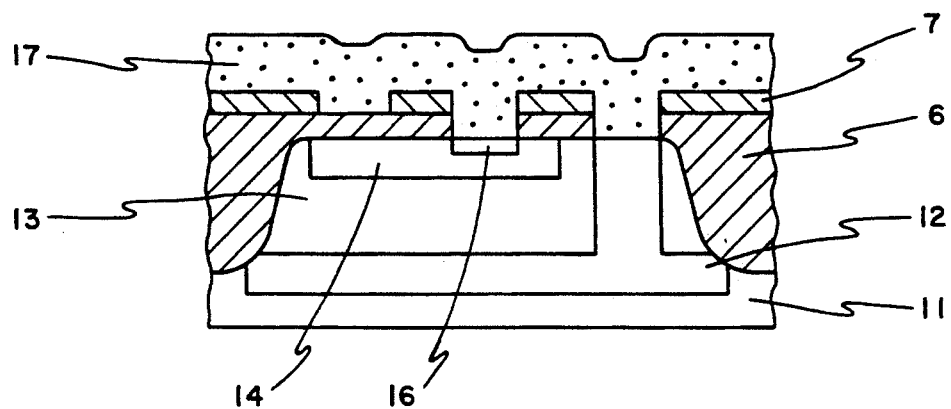
Figure 1D:
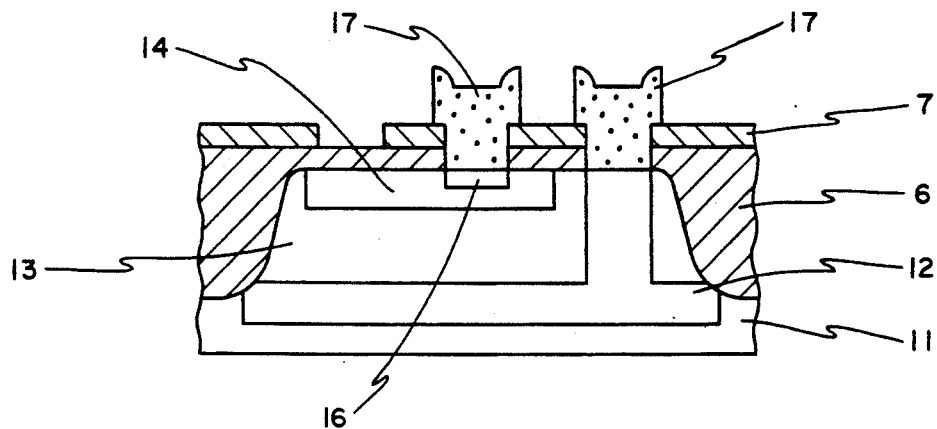
Figure 1E:
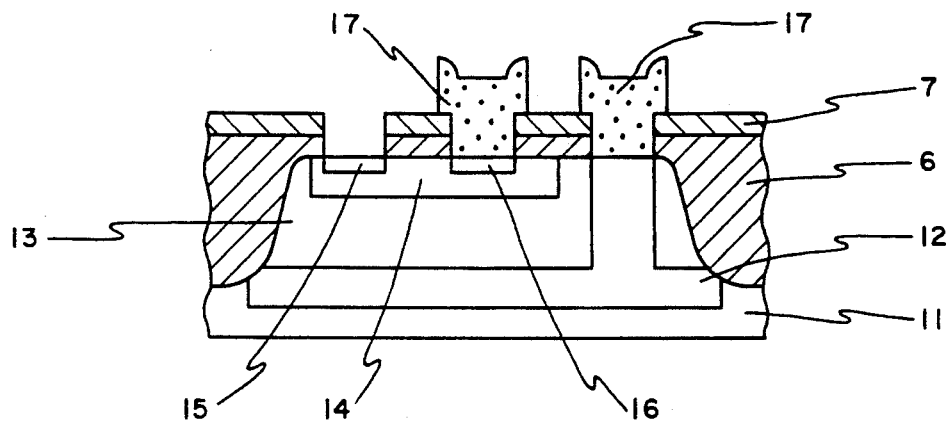
Figure 1F:
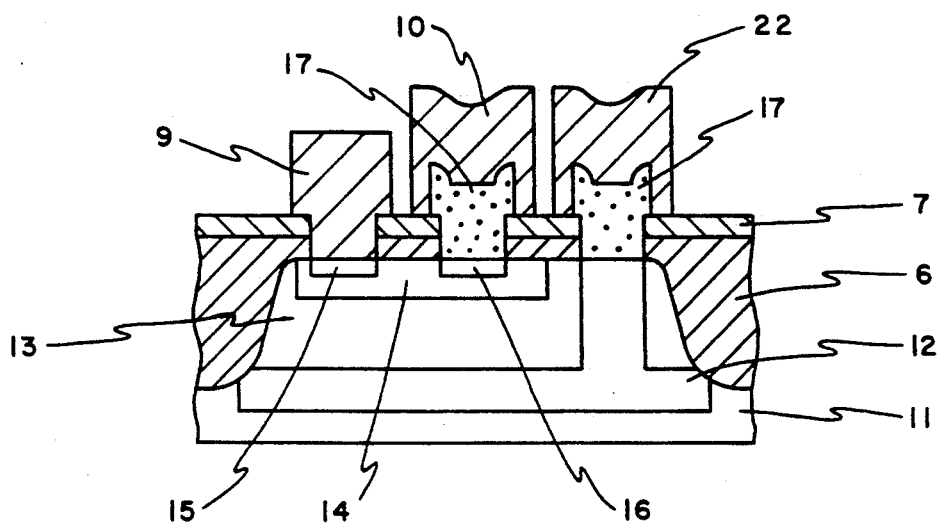
Figure 2A:
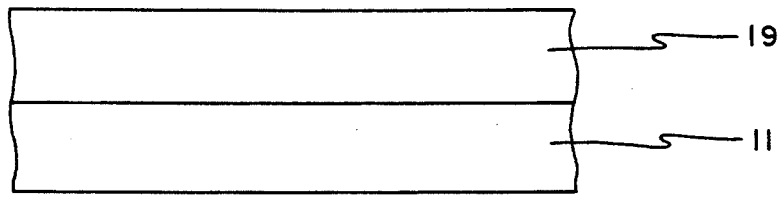
FIGS. 2 (a) to (d) are sectional views showing the crystal growth by means of MBE apparatus.
Figure 2B:
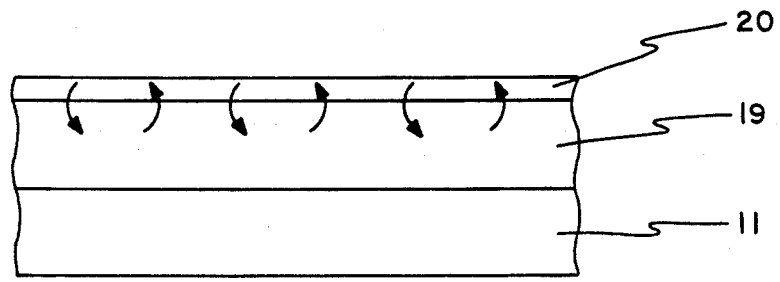
Figure 2C:
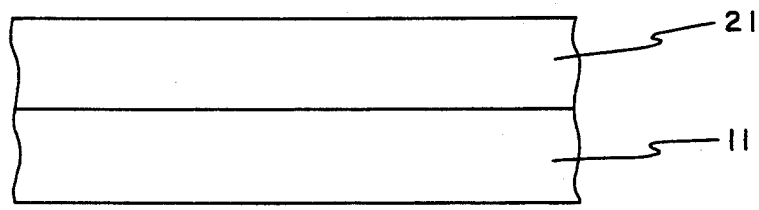
Figure 2D:
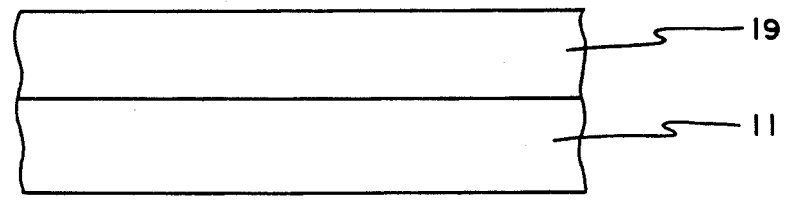

The process of growing an antimony-doped silicon layer by MBE apparatus is described by referring to FIGS. 2 (a) to (d).

Ordinarily, as shown in FIG. 2 (a), a silicon substrate 11 is heated to about 650° C. to vaporize silicon molecules and antimony molecules are vaporized at the same time from Knudsen cell to grow an antimony-doped epitaxial layer 19.

In the case of low concentration doping, there is no problem in this method, but during high concentration doping such as emitter formation, as shown in FIG. 2 (b), antimony molecules with the solid solubility or higher are segregated on the surface of the epitaxial layer to form an antimony segregated layer 20.

Accordingly, in the present invention, the solid phase epitaxy method of amorphous silicon as described below is employed.

First, as shown in FIG. 2 (c), on a silicon substrate 1 of normal temperature, silicon molecules vaporized therefrom and antimony molecules vaporized from Knudsen cell are deposited at the same time to grow an amorphous silicon layer 21. The amorphous silicon layer 21 contains all the antimony molecules vaporized.

Next, as shown in FIG. 2 (d), annealing at 600° to 650° C. will convert the layer to an antimony-doped epitaxial layer 19 by solid phase epitaxy.

Since no surface segregation of antimony occurs in this method, it becomes possible to effect a high concentration doping of antimony with solid solubility or higher.

Figure 3A:
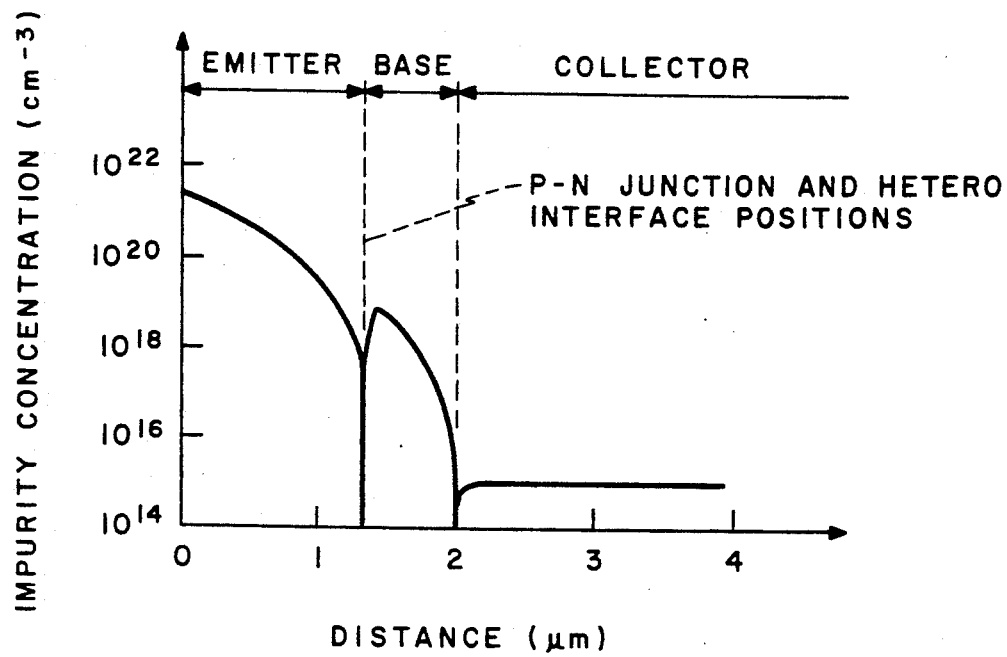
FIGS. 3 (a) and (b) are graphs showing the impurity profile of a heterobipolar transistor.
Figure 3B:
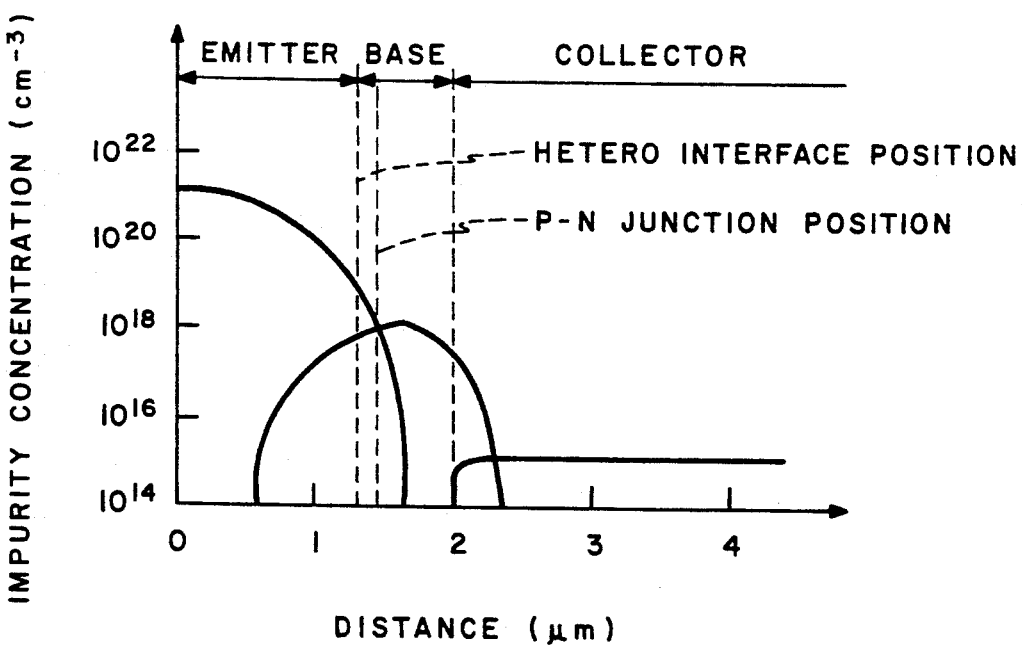
Figure 4A:
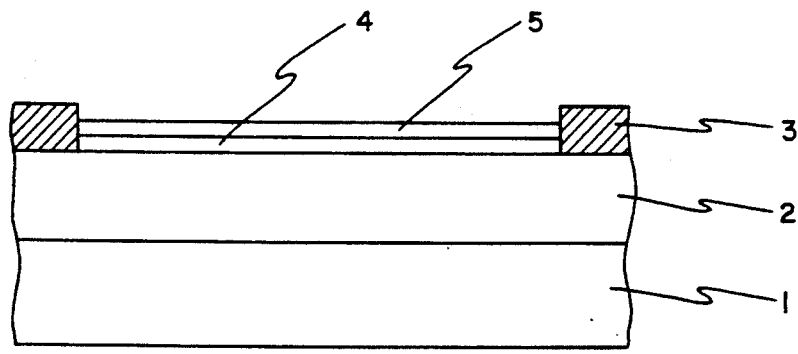
FIGS. 4 (a) to (e) are sectional views showing sequentially the steps of the first embodiment of the present invention.
Figure 4B:
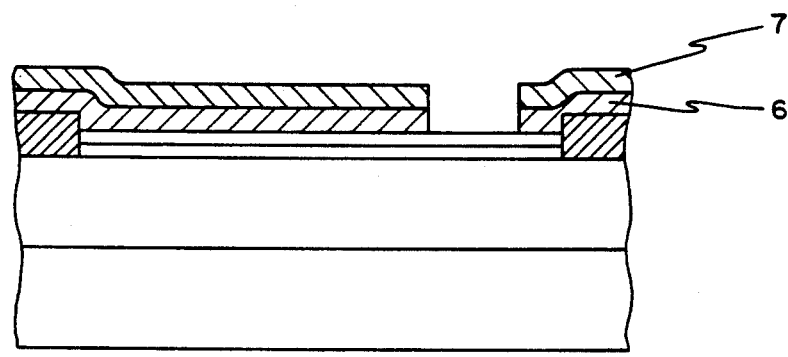
Figure 4C:
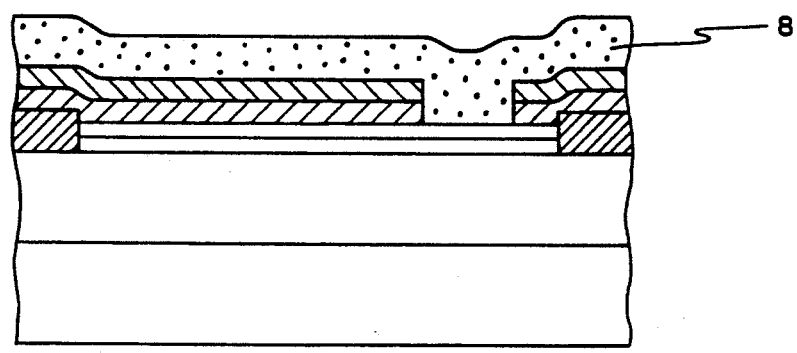
Figure 4D:
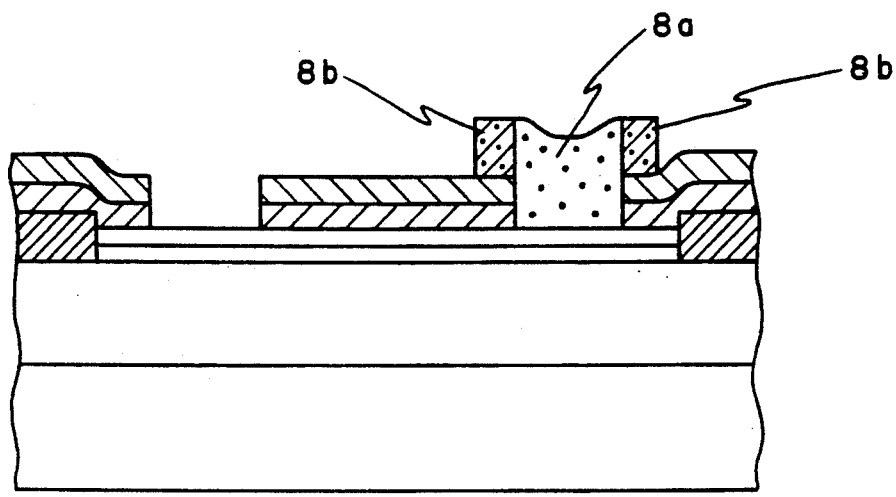
Figure 4E:
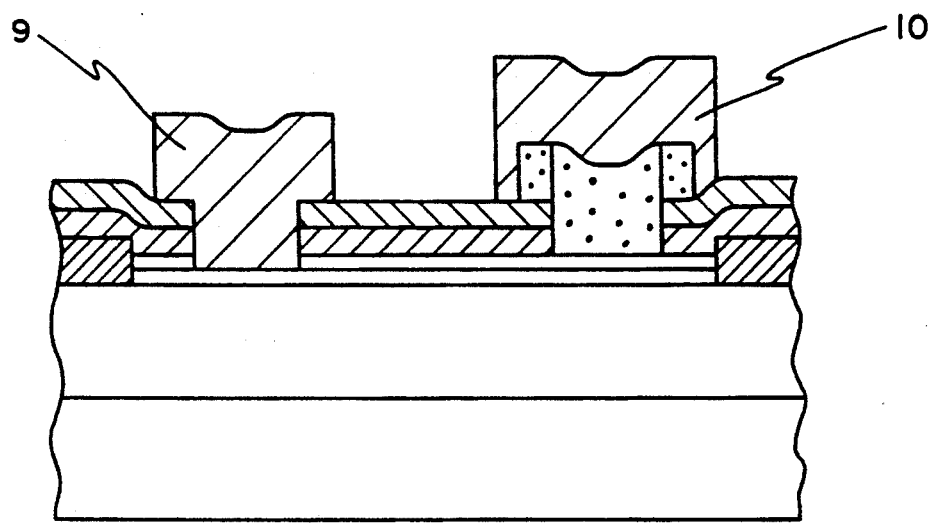

Next, FIG. 3 (a) shows the impurity profile of an ideal heterobipolar transistor. Here, since the position of the P-N junction and the position of the hetero interface are the same, the hetero effect appears to increase the current gain.

In contrast, when a high temperature heat treatment is effected, the impurity profile will be changed through internal diffusion as shown in FIG. 3 (b). That is, arsenic in the emitter will be diffused into base, and the boron in the base into the emitter and the collector. As the result, the position of the hetero interface and the position of the P-N junction are slipped off, whereby not only no sufficient hetero effect can be obtained, but also deterioration of I-V characteristics and lowering in $V_R$ are brought about.

Accordingly, when a non-doped silicon layer with a thickness of 100 to 200 Å is inserted between the emitter and the base, diffusion of boron in the base and arsenic (or antimony) in the emitter is effected within the buffer layer, whereby positional slip-off between the hetero interface and the P-N junction is relaxed to give the hetero effect.

A first embodiment of the present invention is described by referring to FIGS. 4 (a) to (e).

First, as shown in FIG. 4 (a), on an N-type silicon substrate 1 is grown an $N^-$-type epitaxial layer 2 with a specific resistivity of 0.5 to 1.0 Ω.cm and a thickness of 0.8 to 1.0 μm, and a silicon dioxide film 3 with a thickness of 1000 Å formed by thermal oxidation, followed by opening a base predetermined region with a photoresist as the mask.

Next, by use of MBE apparatus, silicon and boron are vaporized at the same time by maintaining the vacuum degree during growth at 650° C. at about $10^{-8}$ Torr, and a P-type epitaxial layer 4 with a thickness of 300 to 500 Å, a carrier concentration of $10^{18}$ $cm^{-3}$ is grown.

Further, by use of MBE apparatus, silicon and boron are vaporized at the same time at 650° C. to form a $P^-$-type epitaxial layer 5 with a thickness of 50 to 200 Å. The $P^-$-type epitaxial layer 5 becomes the buffer layer for maintaining well the crystallinity of the interface between the emitter and the base and the P-N junction. Also, by vaporizing here boron and germanium at the same time, an Si-Ge heterobipolar transistor is formed.

Thereafter, the polysilicon grown on the silicon dioxide film 3 is removed by anisotropic etching by use of a gas such as $CF_4$, etc. with a photoresist as the mask.

Next, as shown in FIG. 4 (b), a silicon dioxide film 6 with a thickness of 1000 Å and a silicon nitride film 7 with a thickness of 1000 Å are formed according to the CVD method, and an emitter predetermined region is opened by anisotropic etching with a photoresist as the mask.

Next, as shown in FIG. 4 (c), silicon and antimony are vaporized at the same time at normal temperature by use of MBE apparatus to deposit a layer 8 of an amorphous silicon doped to high concentrations.

Next, solid phase epitaxy is effected by heating to 650° C. to convert the amorphous silicon in the emitter region to an $N^+$-type epitaxial layer 8a with a thickness of 1000 to 2000 Å. The amorphous silicon in the other region, that is, on the silicon nitride film 7, is converted to a polysilicon layer 8b by such heat treatment [FIG. 4 (d)].

Next, as shown in FIG. 4 (d), by anisotropic etching by use of a gas such as $CF_4+O_2$ with a photoresist as the mask, unnecessary polysilicon layer 8b is removed.

Next, with a photoresist as the mask, a base contact is opened by anisotropic etching.

Next, as shown in FIG. 4 (e), a base electrode 9 and an emitter electrode 10 are formed to complete the device portion.

Figure 5:
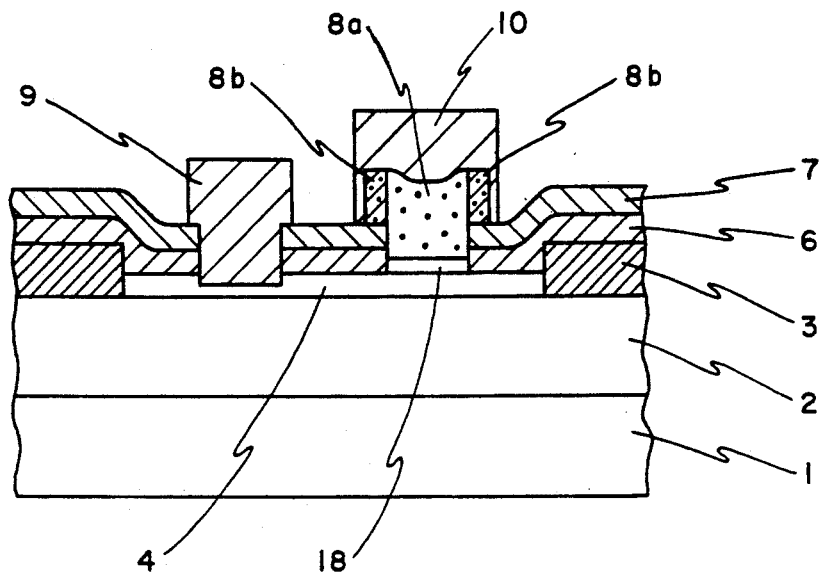
FIG. 5 is a sectional view showing the second embodiment of the present invention.

Next, a second embodiment of the present invention is described by referring to FIG. 5.

After a P-type epitaxial layer 4 is grown by MBE apparatus, without growth of the $P^-$-type epitaxial layer 5, a low concentration impurity layer 18 which becomes the buffer layer (which may be either the P-type or the N-type) is grown before growth of the $N^+$-type epitaxial layer 8a and the polysilicon layer 8b according to the same method as in the first embodiment.

Then, the base electrode 9 and the emitter electrode 10 are formed to complete the device portion.

Figure 6:
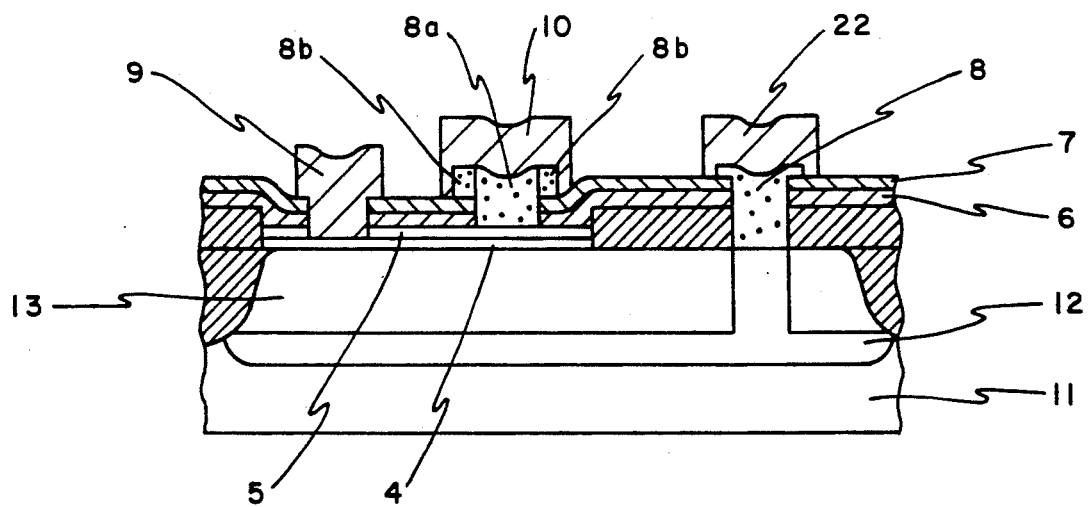
FIG. 6 is a sectional view showing the third embodiment of the present invention.

Next, a bipolar integrated circuit as a third embodiment of the present invention is described by referring to FIG. 6.

In this case, by use of a P-type silicon substrate 11, an $N^+$-type embedded layer 12 is formed before growth of an $N^-$-type epitaxial layer 13 with a specific resistivity of 0.5 to 1.0 ohm and a thickness of 0.8 to 1.0 μm.

Then, a P-type epitaxial layer 4 and a $P^-$-type epitaxial layer 5 are grown, a silicon dioxide film 6 and a silicon nitride film 7 are formed and an amorphous silicon layer 8 which is converted to an $N^+$-type epitaxial layer 8a and a polysilicon layer 8b by heat treatment to follow to form an emitter is grown. Then a base electrode 9, an emitter electrode 10 and a collector electrode 22 are formed to complete the device portion.

Otherwise, an $N^+$ epitaxial layer containing antimony obtained by solid phase growth by use of MBE apparatus can be also applied as the cathode in silicon diode.

Not only the base of an NPN type silicon bipolar transistor but also the emitter can be prepared by low temperature growth by use of MBE apparatus.

Accordingly, no high temperature heat treatment becomes necessary in the steps after MBE growth, whereby there is the effect that there is no change in impurity profile to result in no worsening of the characteristics.

Also, by effecting solid phase epitaxy of amorphous silicon containing antimony at high concentration, high concentration doping of antimony which has been impossible up to date is rendered possible.

I claim:

1. A process for preparing a semiconductor device which comprises steps of:
   growing, in a molecular beam epitaxial growth apparatus, a silicon epitaxial layer of one conductivity type which becomes the base, on a silicon epitaxial layer of the other conductivity type which becomes the collector;
   growing, in a molecular beam epitaxial growth apparatus, a silicon amorphous layer of the other conductivity type doped with an impurity which becomes the emitter, on said one conductivity type silicon epitaxial layer; and
   converting the above silicon amorphous layer to a silicon epitaxial layer of the other conductivity type by annealing heat treatment by a solid phase epitaxy method.

2. The process according to claim 1, wherein one conductivity type is a P-type, the other conductivity type is an N-type and the impurity is antimony.

3. The process according to claim 1, wherein the silicon amorphous layer is formed also on a silicon oxide or nitride layer formed on the silicon epitaxial collector layer for electrode separation and this portion of the silicon amorphous layer is converted to a polysilicon layer by the annealing heat treatment to form an emitter having a polysilicon/epitaxial silicon interface.

* * * * *